United States Patent
Fuertsch et al.

(10) Patent No.: US 7,148,077 B2
(45) Date of Patent: Dec. 12, 2006

(54) MICROMECHANICAL STRUCTURAL ELEMENT HAVING A DIAPHRAGM AND METHOD FOR PRODUCING SUCH A STRUCTURAL ELEMENT

(75) Inventors: Matthias Fuertsch, Gomaringen (DE); Stefan Pinter, Reutlingen (DE); Heribert Weber, Nuertingen (DE); Frank Fischer, Gomaringen (DE); Lars Metzger, Moessingen-Belsen (DE); Christoph Schelling, Reutlingen (DE); Frieder Sundermeier, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/970,069

(22) Filed: Oct. 19, 2004

(65) Prior Publication Data

US 2005/0098840 A1    May 12, 2005

(30) Foreign Application Priority Data

Nov. 7, 2003   (DE) ............................... 103 52 001

(51) Int. Cl.
*H01L 21/00* (2006.01)
(52) U.S. Cl. .................... 438/53; 438/50; 257/419; 73/861.47; 73/715
(58) Field of Classification Search ................ 438/53, 438/50; 257/419; 73/861.47, 715
See application file for complete search history.

(56) References Cited

U.S. PATENT DOCUMENTS

| | | | | |
|---|---|---|---|---|
| 5,095,401 A | * | 3/1992 | Zavracky et al. | 361/283.4 |
| 5,332,469 A | * | 7/1994 | Mastrangelo | 216/2 |
| 5,344,523 A | * | 9/1994 | Fung et al. | 438/53 |
| 5,427,975 A | * | 6/1995 | Sparks et al. | 438/52 |
| 5,510,276 A | * | 4/1996 | Diem et al. | 438/53 |
| 6,012,336 A | * | 1/2000 | Eaton et al. | 73/754 |
| 6,030,851 A | * | 2/2000 | Grandmont et al. | 438/53 |
| 6,373,115 B1 | * | 4/2002 | Kolb et al. | 257/414 |
| 6,551,851 B1 | * | 4/2003 | Gamble et al. | 438/53 |
| 2003/0036215 A1 | * | 2/2003 | Reid | 438/52 |
| 2003/0116813 A1 | * | 6/2003 | Benzel et al. | 257/414 |
| 2003/0215974 A1 | * | 11/2003 | Kawasaki et al. | 438/50 |
| 2004/0065932 A1 | * | 4/2004 | Reichenbach et al. | 257/415 |
| 2004/0093954 A1 | * | 5/2004 | Gottlieb et al. | 73/754 |
| 2004/0232503 A1 | * | 11/2004 | Sato et al. | 257/417 |

FOREIGN PATENT DOCUMENTS

| | | |
|---|---|---|
| DE | 195 27 861 | 1/1997 |
| DE | 103 05 442 | 8/2004 |

* cited by examiner

*Primary Examiner*—Bradley K. Smith
*Assistant Examiner*—Steven J. Fulk
(74) *Attorney, Agent, or Firm*—Kenyon & Kenyon LLP

(57) ABSTRACT

A micromechanical structural element, having a very stable diaphragm, implemented in a pure front process and in a layer construction on a substrate. The layer construction includes at least one sacrificial layer and one diaphragm layer above the sacrificial layer, which is structured for laying bare the diaphragm and generating stabilizing elements on the diaphragm, at least one recess being generated for a stabilizing element of the diaphragm. The structure generated in the sacrificial layer is then at least superficially closed with at least one material layer being deposited above the structured sacrificial layer, this material layer forming at least a part of the diaphragm layer and being structured to generate at least one etch hole for etching the sacrificial layer, which is removed from the region under the etch hole, the diaphragm and the at least one stabilizing element being laid bare, a cavity being created under the diaphragm.

14 Claims, 14 Drawing Sheets

MICROMECHANICAL STRUCTURAL ELEMENT HAVING A DIAPHRAGM AND METHOD FOR PRODUCING SUCH A STRUCTURAL ELEMENT

FIELD OF THE INVENTION

The present invention relates to a micromechanical structural element having at least one diaphragm, the structural element structure being implemented in a layer construction on a substrate. The layer construction includes at least one sacrificial layer and one diaphragm layer above the sacrificial layer. The diaphragm is developed in the diaphragm layer in that under the diaphragm a cavity is developed in the sacrificial layer. The present invention is also directed to a method for producing such a micromechanical structural element. For laying bare the diaphragm, at least one etch hole is generated in at least one material layer above the sacrificial layer, this at least one material layer forming at least one layer structural element of the diaphragm layer. The material of the sacrificial layer is then removed in an isotropic etching step in the region below the etch hole, this bringing about a cavity.

BACKGROUND INFORMATION

Micromechanical structural elements having a self-supporting diaphragm may be used, for example, as sensor components of pressure sensors.

Sensors represent an additional application possibility, known from practical use, for a structural element of the type named at the outset, that are based on thermal effects, such as mass flow sensors, adiabatic gas heat dissipation sensors, thermal angle of inclination sensors, heat conductivity gas sensors or thermal infrared detectors. The sensor components of such sensors include, as a rule, temperature sensors and/or heaters which should be, to the greatest extent possible, thermally decoupled from their surroundings. The better the thermal decoupling, the slighter are the heat losses, and therewith the energy use, and the greater is the sensor's sensitivity. The self-supporting diaphragm, of the micromechanical structural element under discussion here, is used in these applications as a thermally insulated region. In order to minimize the heat dissipation via the substrate, and to hold the heat capacity of the diaphragm to a low value, the diaphragm should be designed as thin as possible. Besides that, it has proven advantageous, in this connection, to implement the diaphragm as made of a dielectric material, having a very slight heat conductivity and low heat capacity.

German published patent application no. 195 27 861 refers to a micromechanical structural element having a self-supporting diaphragm which is used as a sensor component for a mass flow sensor. The production of this sensor component starts from a silicon substrate on whose upper side a diaphragm layer is deposited. Heating elements and temperature sensors in the form of circuit board conductors are then generated on the diaphragm layer. The laying bare of the diaphragm is performed in a separate process step, in which, starting from the back, a cavity is etched into the silicon substrate. This back process is very time-intensive and critical with respect to yield, because one has to etch all the way through the entire thickness of the silicon substrate. The structural elements thus created are also very fragile.

In German patent application document no. 103 05 442, filed Feb. 11, 2003, a micromechanical structural element is discussed and described that has a self-supporting diaphragm, which can be produced in a purely front process. To do this, a diaphragm layer is deposited on a substrate. In order to bare the diaphragm, holes are produced in the diaphragm layer. Then, starting from the front side, the substrate material in the region under the holes is removed in an isotropic etching step, the substrate being able to be designated as a sacrificial layer down to the depth of the cavity produced thereby. A structuring of the back of the substrate in order to lay bare the diaphragm is not required in this instance.

SUMMARY OF THE INVENTION

The exemplary embodiment and/or exemplary method of the present invention provides a way to implement a micromechanical structural element of the type described herein by front processing, whose diaphragm has great stability.

According to the exemplary embodiment and/or exemplary method of the present invention, this is achieved in that the diaphragm is stabilized by at least one stabilizing element that extends into the cavity. To do this, the sacrificial layer is structured within the scope of the production process according to the exemplary embodiment and/or exemplary method of the present invention, at least one recess being produced for a stabilizing element of the diaphragm. The structure generated in the sacrificial layer is then closed again, in that at least one material layer is deposited over the structured sacrificial layer, this material layer forming at least a part of the diaphragm layer, and not being attacked in the isotropic etching step for removing the material of the sacrificial layer. This material layer is structured in order to generate at least one etch hole for etching the sacrificial layer. After that, the sacrificial layer is removed in the area under the etch hole, the diaphragm and the at least one stabilizing element being bared.

According to the exemplary embodiment and/or exemplary method of the present invention, it was recognized that the stability of the diaphragm of a micromechanical structural element may be increased in a simple fashion with the aid of stabilizing elements which extend into the cavity under the diaphragm, without thereby substantially impairing the thermal insulation of the diaphragm from other regions of the structural element. A greater stability of the diaphragm, such as is targeted according to the exemplary embodiment and/or exemplary method of the present invention, does not only increase the service life of the structural element in the field, but also has a positive effect on the manufacturing yield of the structural element and the robustness of the structural element during subsequent installation.

According to the exemplary embodiment and/or exemplary method of the present invention, it was also recognized that a diaphragm having such stabilizing elements is able to be implemented exclusively by surface-micromechanical processing of the structural element structure. As a result, the processing time required for manufacturing the structural element according to the exemplary embodiment and/or exemplary method of the present invention is relatively short. Besides, the structural element according to the exemplary embodiment and/or exemplary method of the present invention may be implemented having a relatively small chip surface, in response to production in a purely front process.

In general, there are various possibilities for implementing the structural element according to the exemplary embodiment and/or exemplary method of the present invention, both with regard to the materials of the layer construction and with regard to the type, geometry and positioning of the diaphragm and the stabilizing elements.

The sacrificial layer of the structural element according to the exemplary embodiment and/or exemplary method of the present invention may be advantageously made up of amorphous, polycrystalline or monocrystalline $S_{1-x}Ge_x$, where $0 \leq x \leq 1$. In this case, known methods may be used for manufacturing the diaphragm having the stabilizing elements, which, within the scope of the micromechanical processing of structural elements, have proven themselves and are easy to handle, such as trench etching processes and the isotropic etching using suitable etching media.

As was mentioned before, the diaphragm of the structural element according to the exemplary embodiment and/or exemplary method of the present invention is formed in a diaphragm layer, which may be made up of only one material layer or may also include a plurality of different material layers. A cavity in the sacrificial layer is located below the diaphragm. This cavity is normally generated in one isotropic etching step, the extension of the cavity, and thus also the size and shape of the diaphragm, being able to be simply determined via the duration of the etching attack. To be sure, proceeding in this manner, one produces only mostly round diaphragms. However, the structural element according to the exemplary embodiment and/or exemplary method of the present invention may also be implemented having any other desired diaphragm geometry. In this case, the geometry and the dimensions of the diaphragm are defined by corresponding trenches in the sacrificial layer, which are filled up with an etch stop material. After removal of the sacrificial layer, the remaining etch stop material then forms the side wall of the cavity, and limits its lateral expansion. Besides the lateral expansion of the cavity, the depth of the cavity may also be determined via the duration of the etching attack. However, the layer construction of the structural element according to the exemplary embodiment and/or exemplary method of the present invention may also include an etch stop layer that is situated below the sacrificial layer, and limits the cavity in depth.

The number and type of stabilizing elements of a structural element according to the exemplary embodiment and/or exemplary method of the present invention depend in the first place on the respective application, and the stability requirements connected therewith. The stabilizing elements may be formed in the shape of columns, crosspieces, honeycombs or nets, or even in the shape of a frame. In addition, the stabilizing elements may extend freely into the cavity or may even be bonded to the floor of the cavity. Depending on the type of the manufacturing process, the stabilizing elements may be developed to be massive, may be made up of one or more different materials and/or include a hollow space.

The diaphragm of the structural element according to the exemplary embodiment and/or exemplary method of the present invention may be furnished with openings, so that the same pressure prevails in the cavity as on the outside of the structural element. In one advantageous variant of the structural element according to the exemplary embodiment and/or exemplary method of the present invention, however, the diaphragm is closed, so that a specified pressure prevails in the cavity, in particular between a vacuum and the atmospheric pressure. Thereby one may achieve, for example, an improved thermal insulation of the diaphragm from the remaining regions of the structural element.

In another advantageous variant of the structural element according to the exemplary embodiment and/or exemplary method of the present invention, the layer construction includes, especially in the region of the diaphragm, an additional structure for decreasing the vertical heat dissipation, which will be explained in greater detail below, in connection with an exemplary embodiment in FIGS. 6a to 6d.

At this point let it be noted that a structural element according to the exemplary embodiment and/or exemplary method of the present invention may also include a plurality of diaphragms. In this case, it proves advantageous if, between the diaphragms, broad support structures are developed, which, acting as heat sinks, prevent cross feed.

As was mentioned at the beginning, the structural element according to the exemplary embodiment and/or exemplary method of the present invention may be used in an advantageous way within the scope of sensors that are based on thermal effects. In particular, let us name, in this connection, the uses for it may include:

in fluid mass flow sensors,
in thermal acceleration sensors,
in thermal rotary speed sensors,
in thermal inclination angle sensors,
in adiabatic gas heat dissipation sensors, especially for H2 sensors and side impact sensors,
in thermal chemical sensors,
in thermal heating plate applications,
in highly dynamic temperature sensors,
in air humidity sensors,
in infrared detectors, especially in gas sensors or infrared cameras,
in thermopiles, and
for HF applications.

BRIEF DESCRIPTION OF THE DRAWINGS

FIG. 7e shows the layer construction of the structural element after the depositing and structuring of a closing layer.

DETAILED DESCRIPTION

The method variant for producing a micromechanical structural element having a diaphragm, shown in FIGS. 1a through 1g, starts out either from a silicon wafer 1, on which first of all a silicon oxide layer 2 and then a monocrystalline or polycrystalline silicon layer or germanium layer 3 has been deposited, or from an SOI (silicon on insulator) wafer whose construction usually includes a monocrystalline or polycrystalline silicon layer 3, which is connected to a silicon substrate 1 via a silicon oxide layer 2. Silicon oxide layer 2 will be denoted below as etch stop layer 2, and silicon layer or germanium layer 3 as sacrificial layer 3.

Figure 1A:
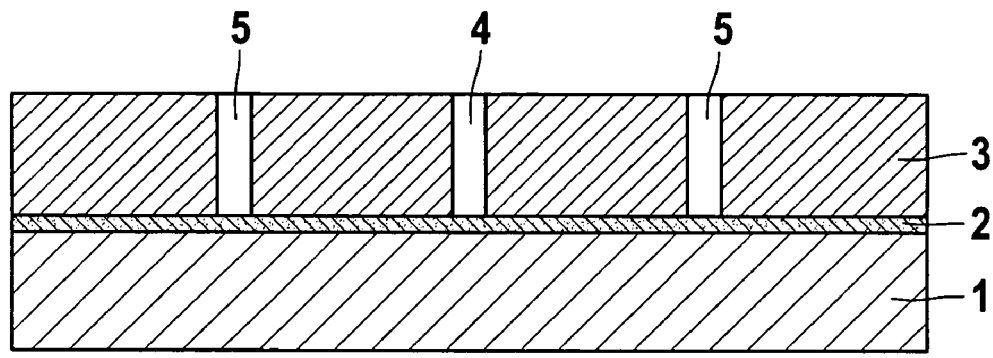
FIG. 1a shows an individual process step(s) for producing a first micromechanical structural element according to the exemplary method of the present invention having a diaphragm.

Corresponding to the exemplary method according to the present invention, sacrificial layer 3 is structured, at least one recess 4 being generated for a stabilizing element. In the method variant shown in FIGS. 1a through 1g, the structuring of the sacrificial layer takes place in a trench process. In this context, besides a recess 4 for a column, a peripheral trench 5 is generated, by which the size and shape of the diaphragm to be generated is defined. FIG. 1a, which shows a section through the layer construction of the structural element structure after the structuring of sacrificial layer 3, makes clear that recess 4 and trench 5 extend through the entire sacrificial layer 3, down to etch stop layer 2. At this point it should be noted that, in the structuring of sacrificial layer 3, V trenches may also be generated. This type of recesses may be more simply completely filled up in a subsequent method step.

Figure 1B:
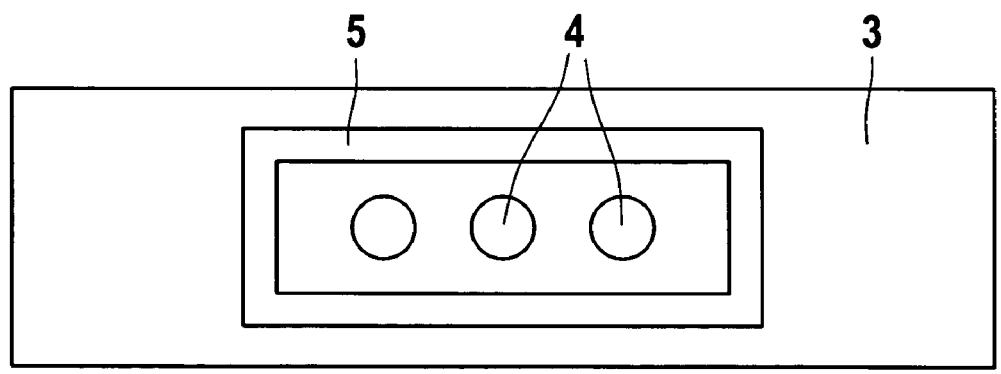
FIG. 1b shows an individual process step(s) for producing a first micromechanical structural element according to the exemplary method of the present invention having a diaphragm.

FIG. 1b, which shows a top view onto structured sacrificial layer 3, makes clear that, with the aid of the trench process used, recesses of any base area may be generated, since, in this context, an anisotropic etching method is involved. At this point it should still be noted that, in the case of FIGS. 1a through 1g, the representations are not to scale. Thus, for instance, sacrificial layer 3 is at least 5 μm thick, while the diameter of recess 4 and the width of trench 5 is usually less than 2 μm, since these openings in sacrificial layer 3 are supposed to be closed at least superficially during a subsequent thermal oxidation.

Figure 1C:
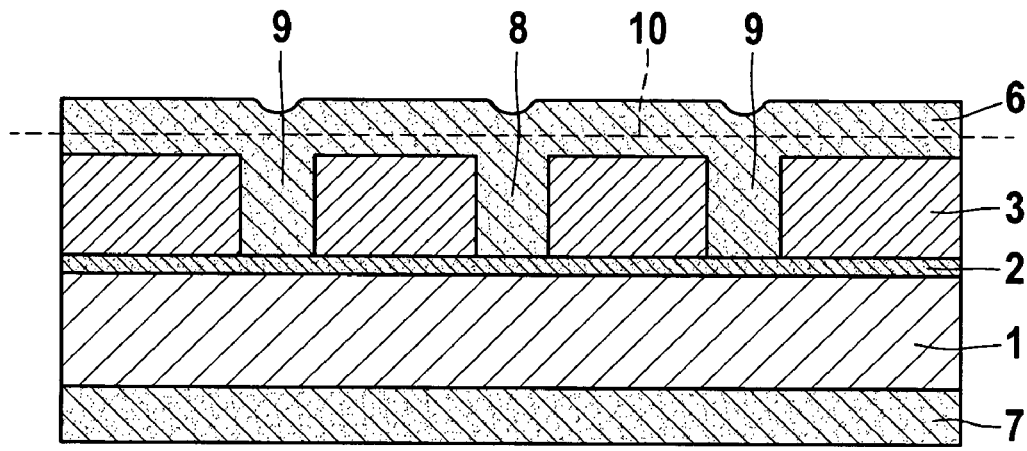
FIG. 1c shows an individual process step(s) for producing a first micromechanical structural element according to the exemplary method of the present invention having a diaphragm.

FIG. 1c shows a section through the layer construction of the structural element structure after the thermal oxidation and/or after the depositing of a dielectric layer $SiO_2/Si_3N_4$, in which, both over structured sacrificial layer 3 an oxide layer 6 has formed, and on the back of the wafer an oxide layer 7 has been formed. Oxide layer 6 extends right into recess 4, whereby an oxide column 8 has been created, and up into trench 5, whereby an oxide frame 9 has been created for the diaphragm that is to be generated. The two oxide layers 6 and 7 each have a thickness of approximately 3 μm. Based on the structuring of sacrificial layer 3, the surface of oxide layer 6 is not planar. Therefore, oxide layer 6 in the method variant described here may now be polished and thinned down to a thickness of ca 0.5 μm, which is indicated by the dashed layer boundary 10. Alternatively, oxide layer 6 may also be completely removed. In this case, after polishing, a new oxide layer 6 of specified thickness may be generated or deposited.

Figure 1D:
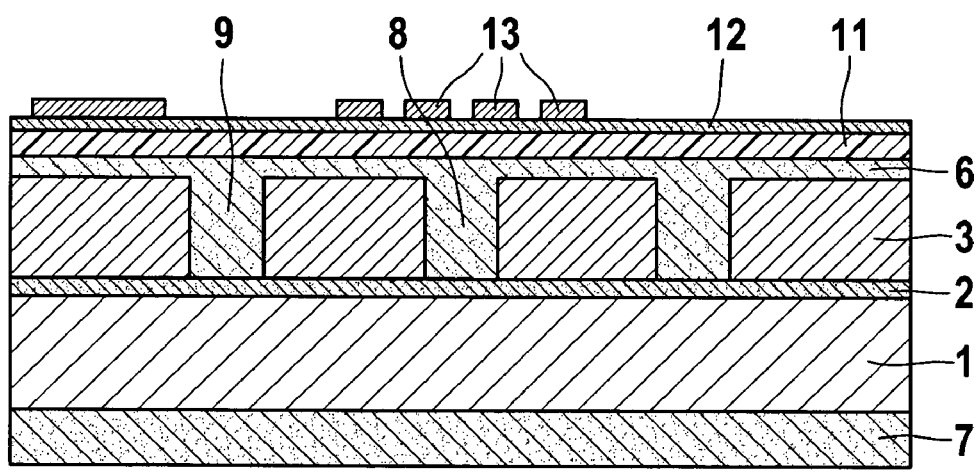
FIG. 1d shows an individual process step(s) for producing a first micromechanical structural element according to the exemplary method of the present invention having a diaphragm.

On top of oxide layer 6, a nitride layer 11 is deposited which is able to be superficially reoxidized. Reoxidized layer 12 that is created in this context is used, for instance, as an adhesive substrate for a subsequent metallization. FIG. 1d shows a section through the layer construction of the structural element structure after a structuring of the metallization, in which circuit board conductors 13, particularly heating element and temperature sensor, have been generated. At this point it should be noted that the circuit board conductors may also be implemented in another conductive layer, such as in a polysilicon layer.

Figure 1E:
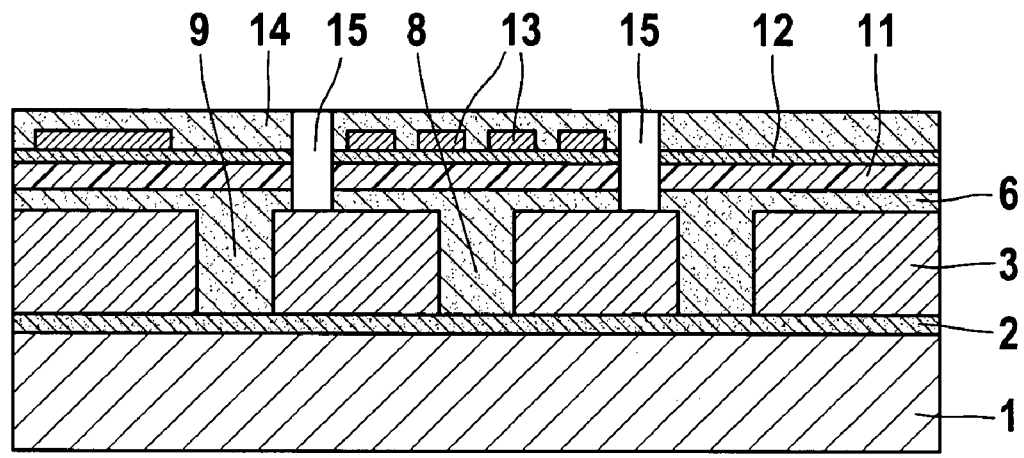
FIG. 1e shows an individual process step(s) for producing a first micromechanical structural element according to the exemplary method of the present invention having a diaphragm.

Over this, a thin passivating layer 14, for example of CVD (chemical vapor deposition) oxide, is generated. In this state, annealing can now take place for setting the thermal resistance coefficient and for drift stabilizing of circuit board conductors 13. FIG. 1e shows a section through the layer construction of the structural element structure, after etch holes 15 have been generated for baring the diaphragm in the region enclosed by oxide frame 9. These etch holes 15 are generated by dry chemical or wet chemical etching, and penetrate passivating layer 14, reoxidized layer 12, nitride layer 11 and oxide layer 6, which each form a layer proportion of the diaphragm layer of the structural element in the exemplary embodiment explained here.

Figure 1F:
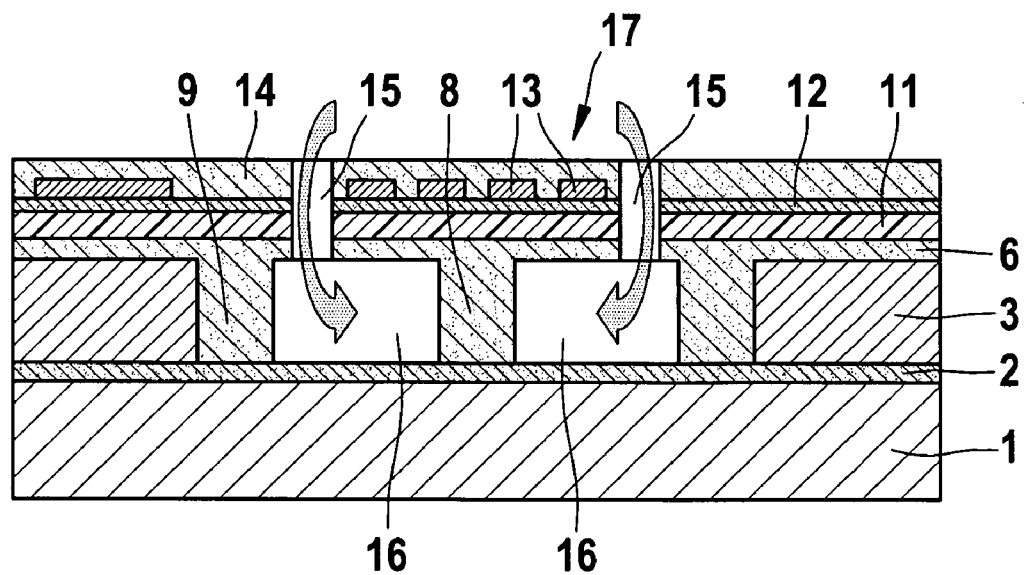
FIG. 1f shows an individual process step(s) for producing a first micromechanical structural element according to the exemplary method of the present invention having a diaphragm.

Subsequently, the material of sacrificial layer 3 is removed within oxide frame 9 in an isotropic gas phase etching process, which is shown in FIG. 1f. In this method step, for example, a plasmaless, fluorine-containing gas etching mixture using interhalogenides, such as $ClF_3$, $BrF_3$ or $ClF_5$ and/or using noble gas halogenides, such as $XeF_2$ are used, since these have great selectivity with respect to silicon oxide. This creates a cavity 16, which is bordered laterally by oxide frame 9 and in depth by etch stop layer 2. Diaphragm 17, that has now been bared, is supported by oxide column 8 that is connected to etch stop layer 2 and substrate 1.

Figure 1G:
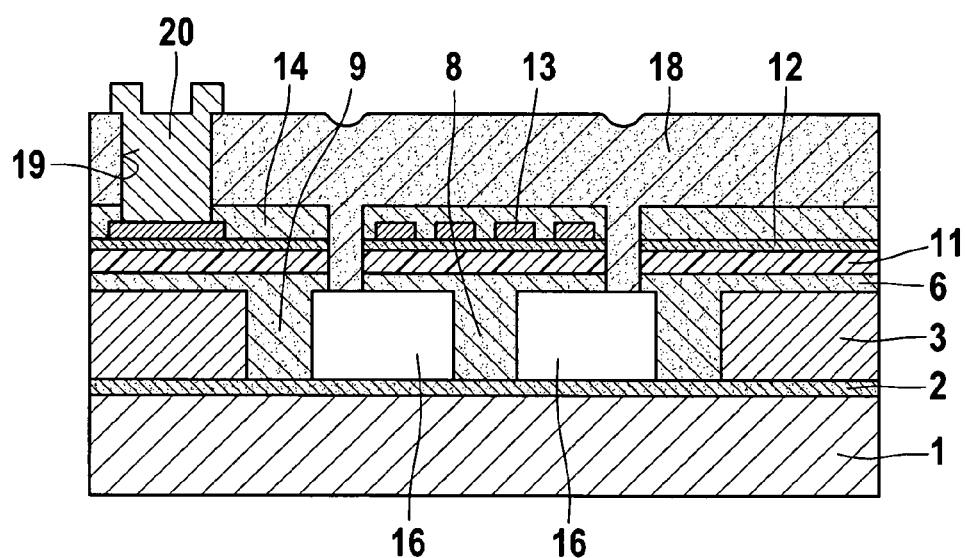
FIG. 1g shows an individual process step(s) for producing a first micromechanical structural element according to the exemplary method of the present invention having a diaphragm.

In order to planarize the surface of the structural element and in order to close etch holes 15 in diaphragm 17, a PECVD (plasma enhanced chemical vapor deposition) oxide 18 is deposited at this point. However, a BPSG reflow glass may also be deposited. Thereafter, a further annealing may take place, and additional passivating layers and/or metallizing layers may be applied. FIG. 1g shows a section through the layer construction of the structural element structure after a contact hole 19 has been opened and bondland (a contact surface on the cover layer of an electronic structure) metallization 20 has been applied and structured.

Figure 2:
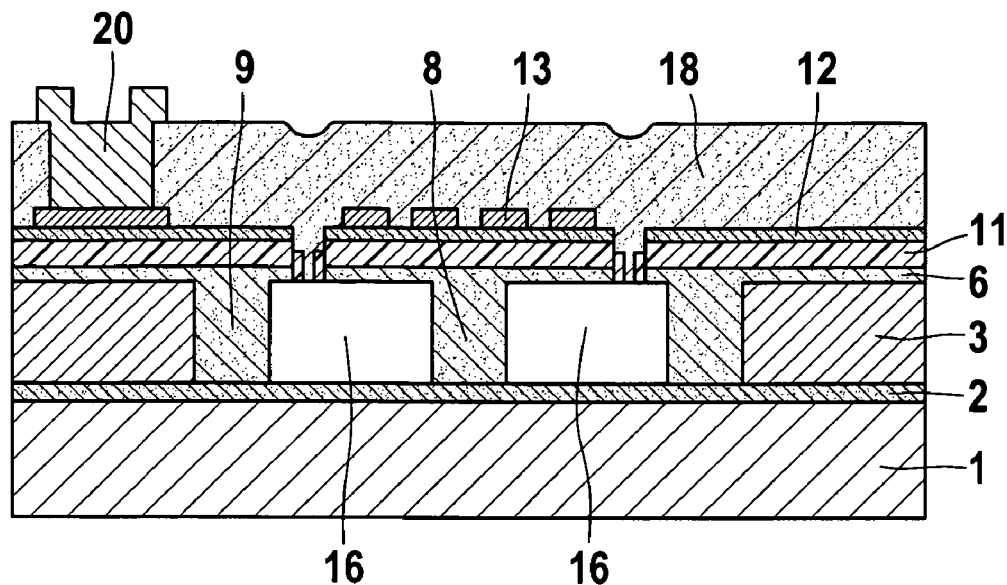
FIG. 2 shows the section through the layer construction of a second structural element according to the present invention that has been produced in a modified variant of the method described in connection with FIGS. 1a through 1g.

The structural element shown in FIG. 2 was produced in a modified variant of the method described in connection with FIGS. 1a through 1g. In this case, oxide layer 6 was structured after the thinning down and before depositing nitride layer 11, oxide layer 6 having been opened in the area of etch holes 15 that are to be produced. This method conduct may be advantageous with a view to forming etch holes 15, since in this case only two layers made of two different materials, namely PECVD oxide 18 and nitride layer 11 have to be etched through in order to produce etch holes 15. As opposed to that, within the scope of the method described in connection with FIGS. 1a through 1g, for this purpose, three layers made of two different materials, namely PECVD oxide 18, nitride layer 11 and oxide layer 6 are etched through. In this context, of necessity, relatively large etch holes 15 are created, since when etching oxide layer 6, PECVD oxide 18 is also etched again along with it.

Figure 3:
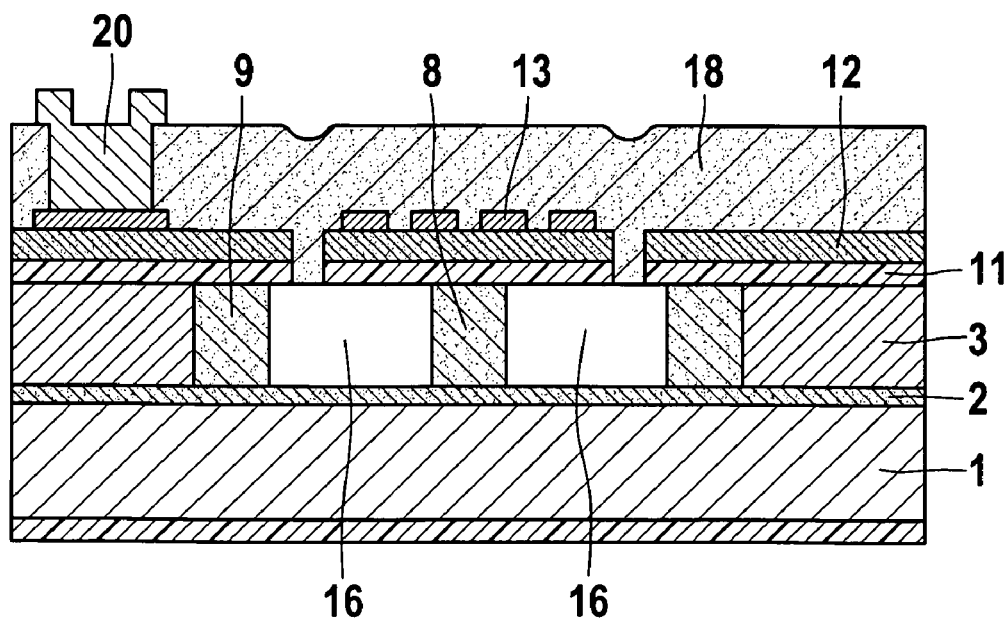
FIG. 3 shows the section through the layer construction of a third structural element according to the present invention that has also been produced in a modified variant of the method described in connection with FIGS. 1a through 1g.

The structural element shown in FIG. 3 was also produced in a modified variant of the method described in connection with FIGS. 1a through 1g. In this case, oxide layer 6 was polished down right up to sacrificial layer 3. Subsequently to that, a nitride layer 11 was deposited directly over sacrificial layer 3, so that only recess 4 and trench 5 are filled up with oxide.

Figure 4A:
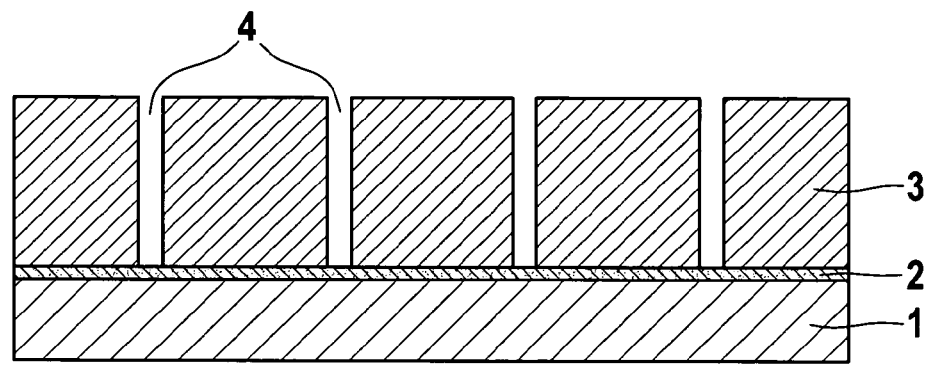
FIG. 4a shows the individual process step(s) for producing a fourth micromechanical structural element according to the present invention, having a diaphragm.

Just as the method variant for producing a micromechanical structural element having a diaphragm, shown in FIGS. 1a through 1g, the method variant shown in FIGS. 4a through 4d starts out either from a silicon wafer 1, on which first of all a silicon oxide layer 2 and then a monocrystalline or polycrystalline silicon layer or germanium layer 3 has been deposited, or from an SOI (silicon on insulator) wafer whose construction usually includes a monocrystalline or polycrystalline silicon layer 3, which is connected to a silicon substrate 1 via a silicon oxide layer 2. In the following, silicon layer 2 is also denoted as etch stop layer 2, and silicon layer or germanium layer 3 is also denoted as sacrificial layer 3. Sacrificial layer 3 is structured in this instance in an RIE etching process, the recesses or trenches 4 being generated, which extend through the entire sacrificial layer 3 right up to etch stop layer 2, which is shown in FIG. 4a.

Figure 4B:
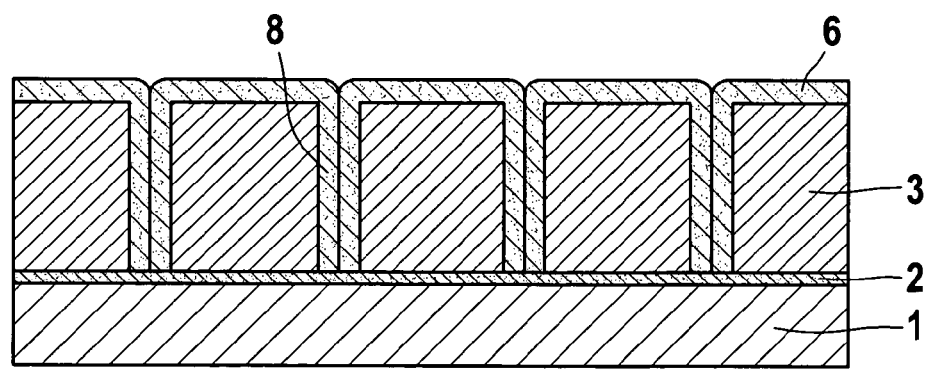
FIG. 4b shows the individual process step(s) for producing a fourth micromechanical structural element according to the present invention, having a diaphragm.

FIG. 4b shows a section through the layer construction of the structural element structure after the thermal oxidation, in which the trenches 4 have been completely filled up, since the width of trenches 4 has been selected correspondingly. Based on the structuring of sacrificial layer 3, the surface of oxide layer 6 has depressions which may be leveled in a subsequent planarizing step.

Figure 4C:
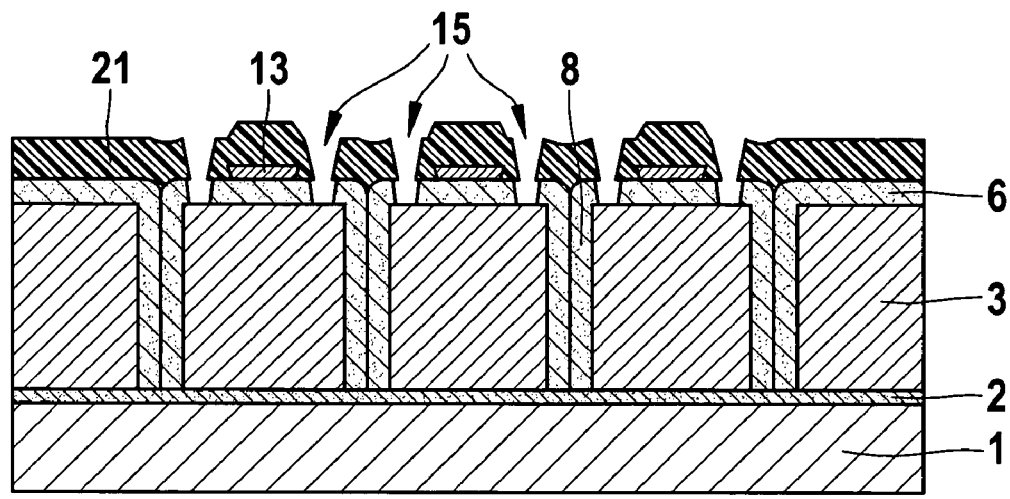
FIG. 4c shows the individual process step(s) for producing a fourth micromechanical structural element according to the present invention, having a diaphragm.

In the method variant described here, heating elements and temperature sensors in the form of circuit board conductors 13 are now generated on oxide layer 6. In order to achieve an optimal heat insulation, these should not be situated over the oxide columns or oxide crosspieces 8. Thereafter, oxide layer 6 is structured with the aid of a structured photo-resist layer 21 in an oxide etching process, in order to generate etch holes 15 for laying bare the diaphragm. FIG. 4c shows a section through the layer construction of the structural element structure after the structuring of oxide layer 6.

Figure 4D:
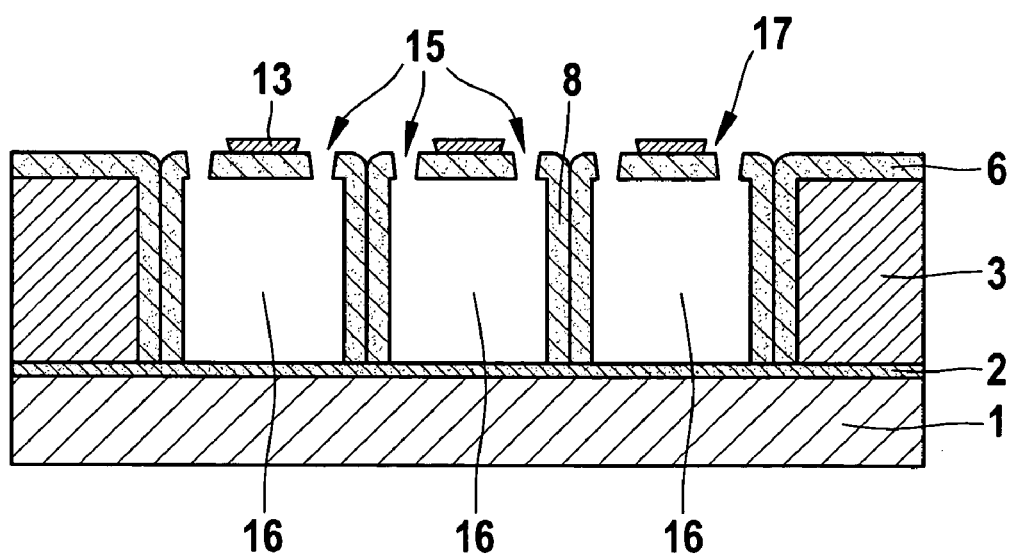
FIG. 4d shows the individual process step(s) for producing a fourth micromechanical structural element according to the present invention, having a diaphragm.

FIG. 4d shows a layer construction of the structural element structure, after the material of sacrificial layer 3 has been removed in the region of the diaphragm below circuit board conductors 13, with the aid of a plasmaless, fluorine-containing gas etching mixture, having interhalogenides such as $ClF_3$, $BrF_3$ or $ClF_5$ and or having noble gas halogenides, such as $XeF_2$. In this context, a cavity 16 has been created, which at the bottom is bordered by etch stop layer 2. Diaphragm 17, that has now been bared, is supported by oxide crosspieces 8 that are connected to etch stop layer 2 and substrate 1. Based on the comparatively slight heat conductivity of air, a good thermal insulation is achieved of the heating elements and the temperature sensors from substrate 1. Subsequently, a passivating layer, such as PECVD oxide or PECVD nitride may be deposited and structured.

Figure 5A:
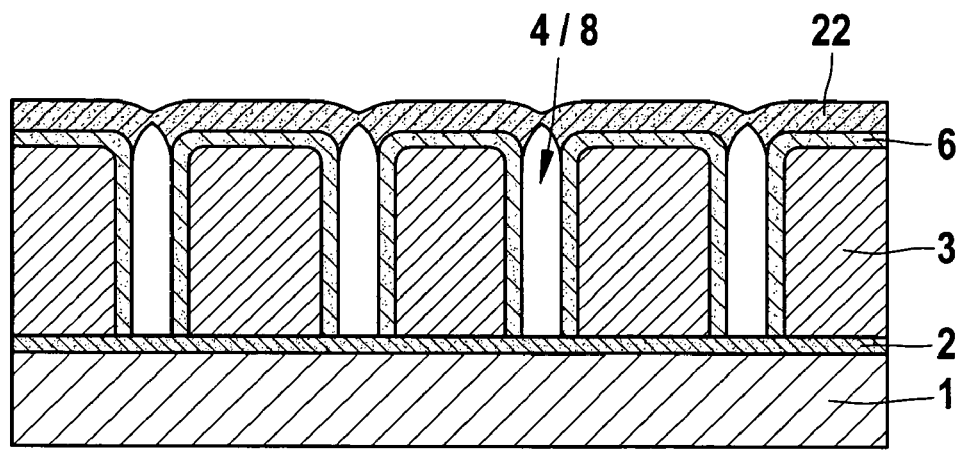
FIG. 5a shows the individual process step(s) for producing a fifth micromechanical structural element according to the present invention, having a diaphragm.

The method variant shown in FIGS. 5a through 5d represents a modification of the method variant that was described above in connection with FIGS. 4a through 4d. As a difference from this, in the method variant shown in FIGS. 5a through 5d, the width of trenches 4 in sacrificial layer 3 is selected so that, oxide layer 6 generated within the scope of a thermal oxidation is not sufficient to close trenches 4 superficially. To do that, in this case an additional oxide layer 22 (such as of nonconformal PECVD oxide) is generated, which is shown in FIG. 5a. In this context, stabilizing elements having cavities may also be created. If necessary, the surface of this oxide layer 22 may also be leveled.

Figure 5B:
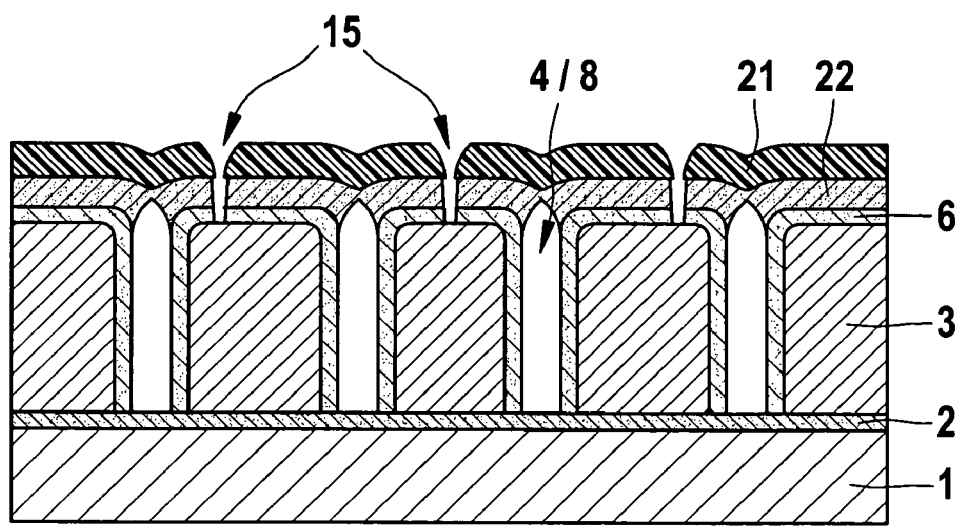
FIG. 5b shows the individual process step(s) for producing a fifth micromechanical structural element according to the present invention, having a diaphragm.

In the method variant described here, the diaphragm is then first laid bare, before the circuit board conductors are produced on the diaphragm. To do this, oxide layers 22 and 6 are structured with the aid of a structured photo-resist layer 21 in an oxide etching process, so as first of all to generate etch holes 15, which is shown in FIG. 5b.

Figure 5C:
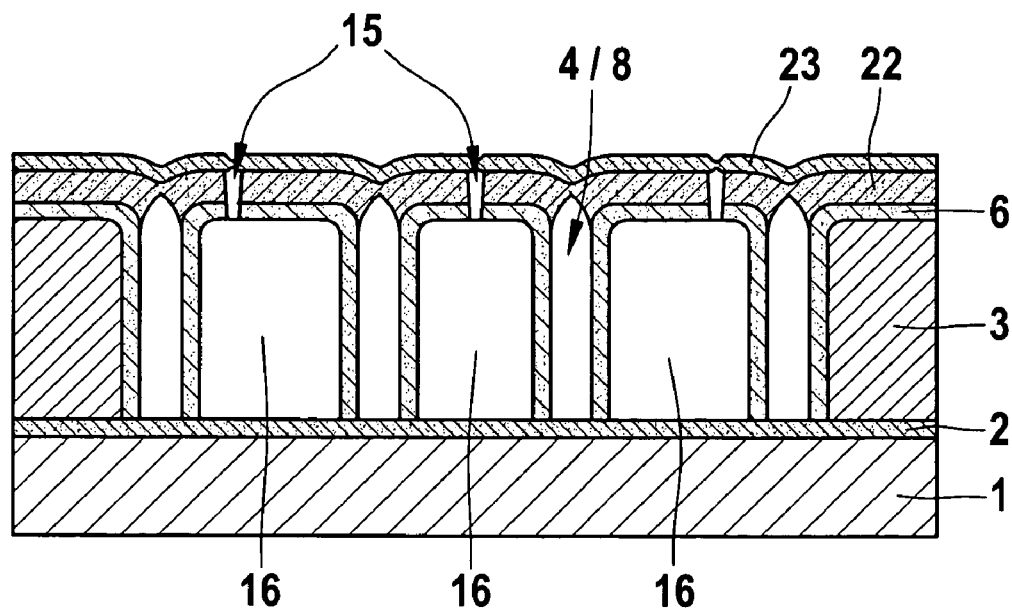
FIG. 5c shows the individual process step(s) for producing a fifth micromechanical structural element according to the present invention, having a diaphragm.

FIG. 5c shows the layer construction of the structural element structure after the material of sacrificial layer 3 has been removed in an isotropic etching process via etch holes 15, a cavity 16 having been created by this. Subsequently, etch holes 15 were closed, using an additional oxide layer 23, such as one made of nonconformal PECVD oxide. Cavity 16, thus closed, in this case forms an air or vacuum chamber by which one may achieve an especially good thermal insulation of the diaphragm.

Figure 5D:
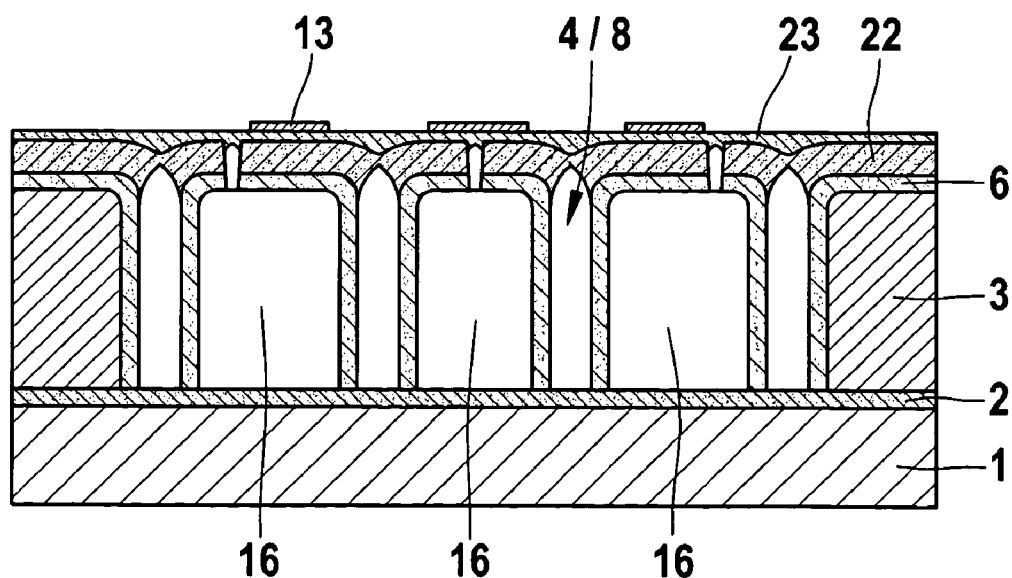
FIG. 5d shows the individual process step(s) for producing a fifth micromechanical structural element according to the present invention, having a diaphragm.

FIG. 5d shows a layer construction of the structural element structure after the diaphragm surface has been planarized, and heating elements and temperature sensors in the form of circuit board conductors 13 have been produced on the diaphragm. Subsequently, here too, a passivating layer, such as PECVD oxide or PECVD nitride may be deposited and structured.

Figure 6A:
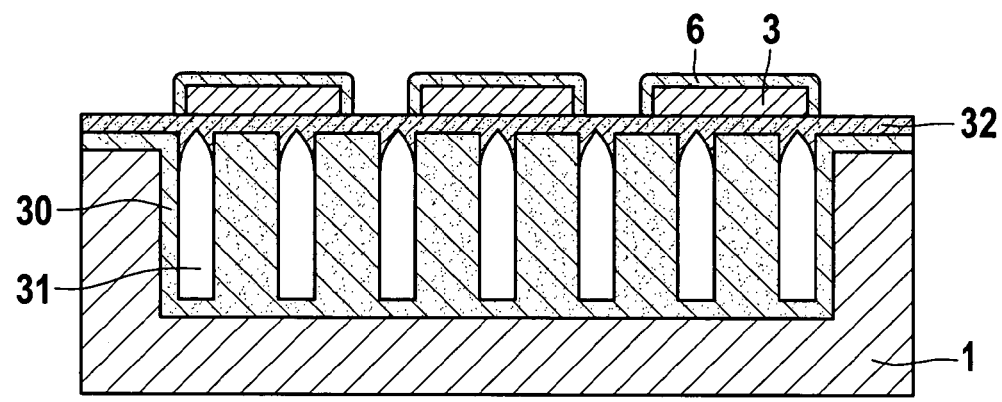
FIG. 6a shows the individual process step(s) for producing a sixth micromechanical structural element according to the present invention, having a diaphragm.

The method variant, shown in FIGS. 6a through 6d, for producing a micromechanical structural element having a diaphragm, starts from a substrate 1 in which a silicon dioxide block 30 having a plurality of vertical columnar-shaped cavities 31 is formed, which is closed off by a planarized oxide closing layer 32. This structure is used to decrease the vertical heat dissipation. Oxide closing layer 32 is additionally used in the method variant described here as etch stop layer for etching the sacrificial layer. A polysilicon layer is applied, in this instance, to oxide closing layer 32 as sacrificial layer, and is structured. In this context, sacrificial layer 3 is left standing only in the region of the heating elements and temperature sensors that are to be produced. Subsequently, these silicon regions are jacketed by an oxide layer 6, which is shown in FIG. 6a.

Figure 6B:
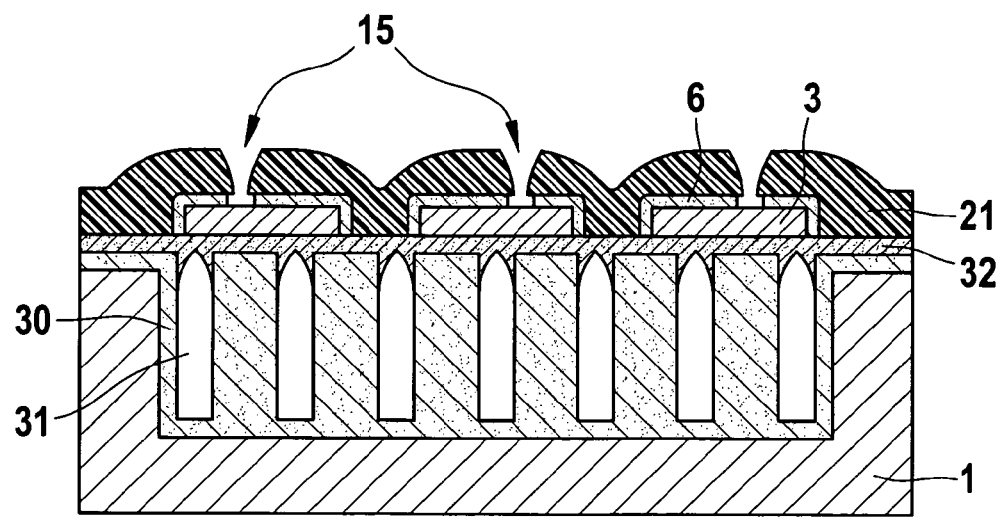
FIG. 6b shows the individual process step(s) for producing a sixth micromechanical structural element according to the present invention, having a diaphragm.

Oxide layer 6 is then structured with the aid of a structured photo-resist layer 21 in an oxide etching process, so as to generate etch holes 15 as etching access to the sacrificial layer regions, which is shown in FIG. 6b.

Figure 6C:
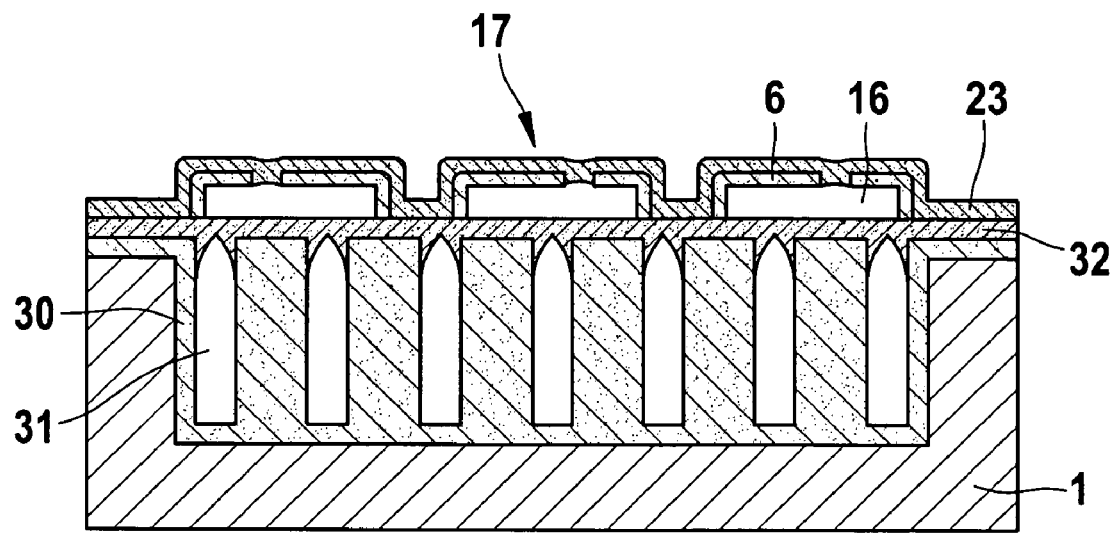
FIG. 6c shows the individual process step(s) for producing a sixth micromechanical structural element according to the present invention, having a diaphragm.

FIG. 6c shows a layer construction of the structural element structure after the material of sacrificial layer 3 has been removed in the jacketed regions, and thereby diaphragms 17 have been laid bare in oxide layer 6. For this, in this case too, a plasmaless, fluorine-containing gas etching mixture was used, having interhalogenides, such as $ClF_3$, $BrF_3$ or $ClF_5$ and/or having noble gas halogenides, such as $XeF_2$. Etch holes 15 were then closed, using an additional oxide layer 23, such as one made of nonconformal PECVD oxide.

Figure 6D:
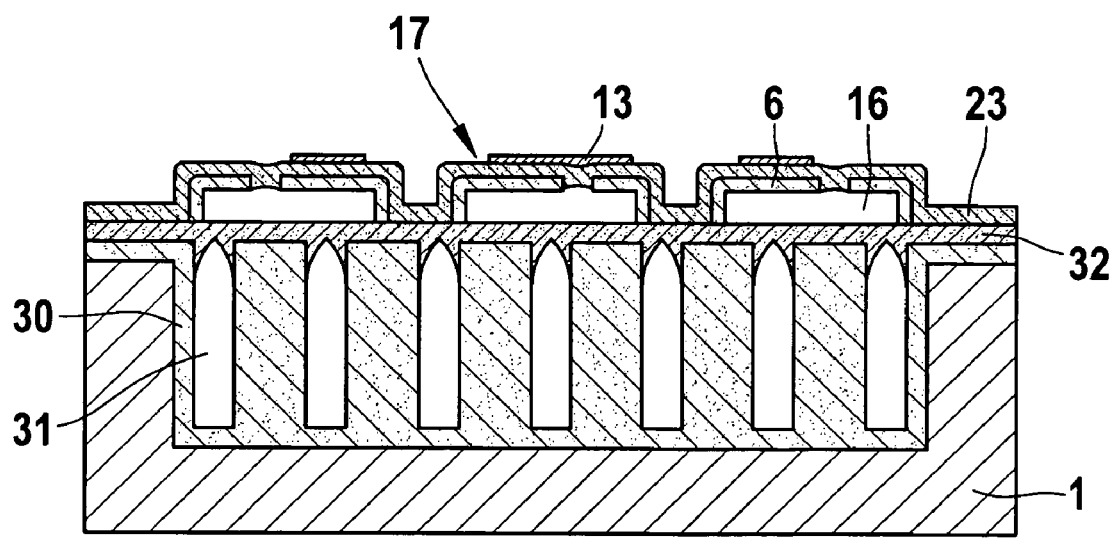
FIG. 6d shows the individual process step(s) for producing a sixth micromechanical structural element according to the present invention, having a diaphragm.

FIG. 6d shows a section through the layer construction of the structural element structure after heating elements and temperature sensors in the form of circuit board conductors 13 have been generated on oxide layer 23 over diaphragms 17 and therewith over air or vacuum chambers 16. These air or vacuum chambers 16 contribute, additionally to structured silicon dioxide block 30, to the thermal insulation of the heating elements and the temperature sensors on diaphragms 17. Subsequently, here too, a passivating layer, such as PECVD oxide or PECVD nitride may be deposited and structured.

At this point it should be noted that stabilizing elements for diaphragm 17 may also be provided in the exemplary embodiment just described above, that extend into the air or vacuum chamber and could possibly be bonded to oxide closing layer 32.

Figure 7A:
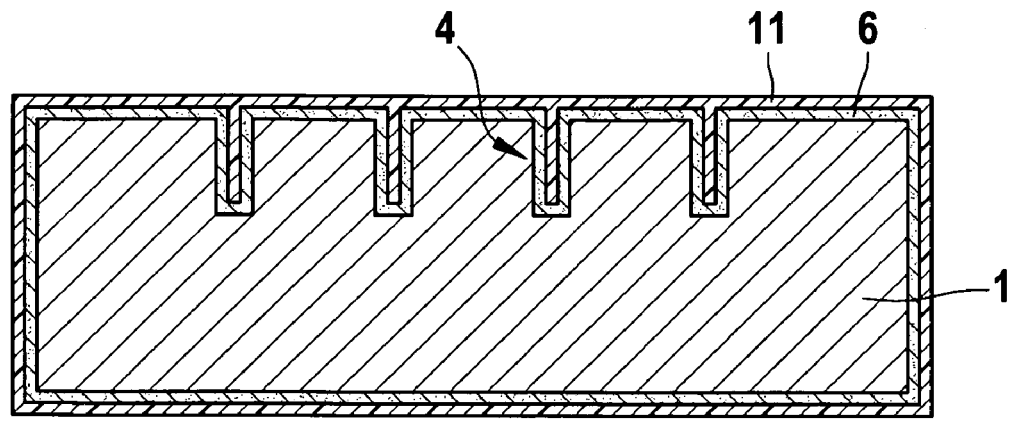
FIG. 7a shows the individual process step(s) for producing a seventh micromechanical structural element according to the present invention, having a diaphragm.

The method variant shown in FIGS. 7a through 7e, for producing a micromechanical structural element having a diaphragm, starts from a simple silicon wafer 1, whose upper layer area is used as sacrificial layer. Accordingly, the surface of silicon wafer 1 is structured, recesses 4 for stabilizing elements being produced. In this case the structuring takes place in a trench process, the depth of the recesses being determined essentially by the number of etching cycles and the duration of the etching attack. After that, a thermal oxidation takes place in which an oxide layer 6 is produced, on which a nitride layer 11 may then be deposited. In this context, recesses 4 are filled up and closed, which is shown in FIG. 7a. Subsequently, additional dielectric layers may be deposited or produced, such as a reoxide.

Figure 7B:
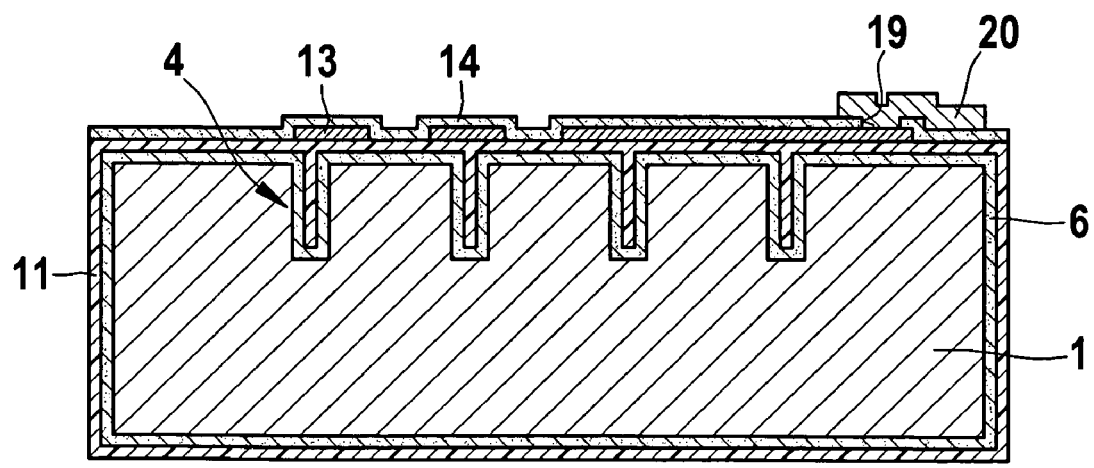
FIG. 7b shows the individual process step(s) for producing a seventh micromechanical structural element according to the present invention, having a diaphragm.

In order to produce thermosensors in the form of circuit board conductors 13, a metallization is deposited on nitride layer 11 and is structured. Over this, a thin passivating layer 14 is produced as intermediate insulator, which is provided with contact holes 19. FIG. 7b shows a section through the layer construction of the structural element structure after the generation of bondlands 20.

Figure 7C:
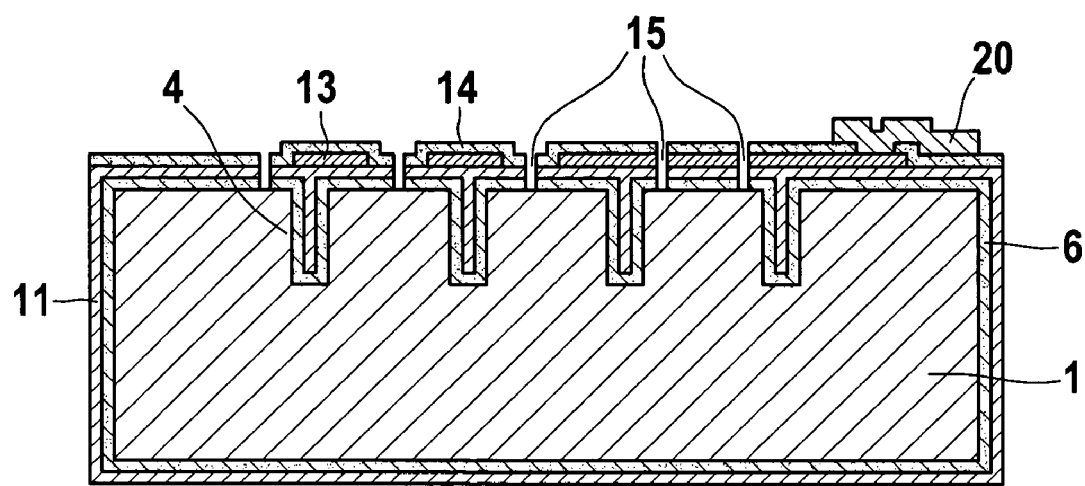
FIG. 7c shows the individual process step(s) for producing a seventh micromechanical structural element according to the present invention, having a diaphragm.

FIG. 7c shows the layer construction of the structural element structure after etch holes 15 have been generated in the layer construction of the diaphragm. Etch holes 15 penetrate through passivating layer 14, nitride layer 11 and oxide layer 6.

Figure 7D:
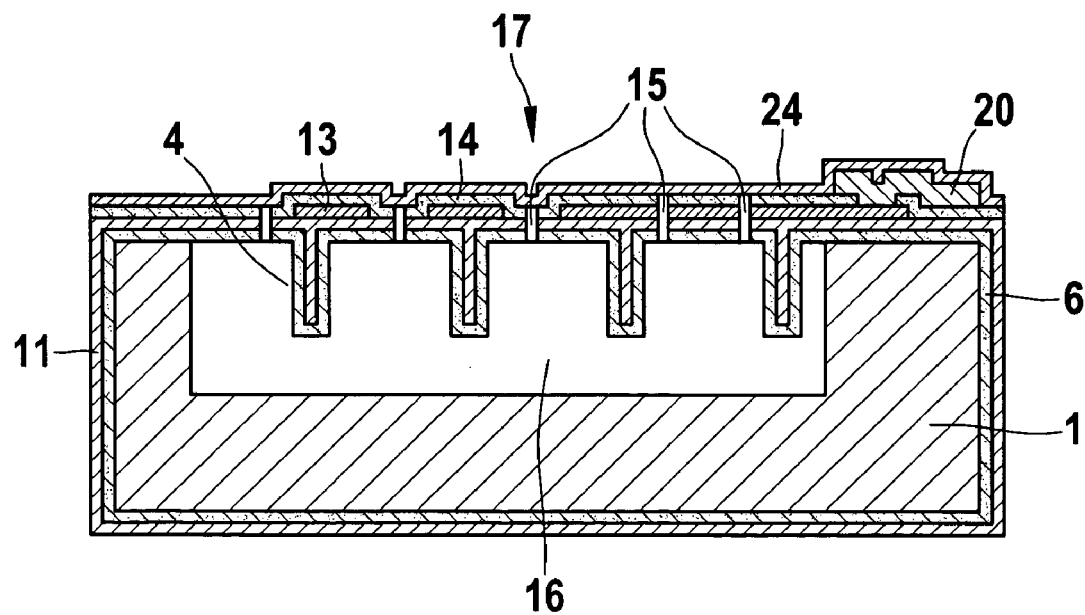
FIG. 7d shows the individual process step(s) for producing a seventh micromechanical structural element according to the present invention, having a diaphragm.

In the exemplary embodiment explained here, a dielectric layer 24 is then deposited, which is permeable to the etching medium that is used for laying bare the diaphragm. Subsequently, the diaphragm is laid bare in an isotropic gas etching process, which is shown in FIG. 7d. The size and depth of the cavity 16 created in this connection is essentially determined by the duration of the etching attack. Diaphragm 17, that has now been laid bare, is stabilized by stabilizing elements 8, that extend into cavity 16, which is made of silicon oxide having a nitride core.

Figure 7E:
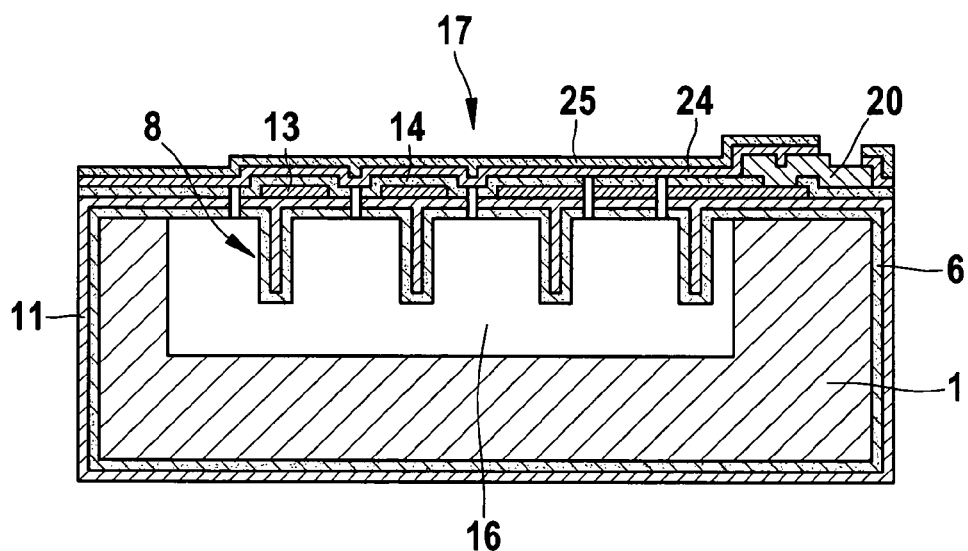
FIG. 7e shows the individual process step(s) for producing a seventh micromechanical structural element according to the present invention, having a diaphragm, and in particular.

FIG. 7e shows the layer construction of the structural element after the depositing and structuring of a closing layer 25, with the aid of which a vacuum may be locked into cavity 16.

The reference numbers (numerals) are as follows:
1 substrate
2 etch stop layer
3 sacrificial layer
4 recess—stabilizing element/trench
5 trench
6 oxide layer—above sacrificial layer
7 oxide layer—wafer back side
8 oxide column/oxide crosspiece
9 oxide frame
10 layer border after thinning down
11 nitride layer
12 reox layer
13 circuit board conductors
14 passivating layer
15 etch hole
16 cavity
17 diaphragm
18 PECVD oxide
19 contact hole
20 bondland metallization
21 photo-resist layer
22 oxide layer—trench closing
23 oxide layer—etch hole closing
24 dielectric layer—permeable
25 closing layer
30 silicon dioxide block
31 hollow space—silicon dioxide block
32 oxide closing layer—silicon dioxide block.

What is claimed is:

1. A micromechanical structural element comprising:
at least one diaphragm arrangement, wherein the structural element structure is implemented in a layer construction on a substrate, the layer construction includes at least one sacrificial layer, one diaphragm layer above the sacrificial layer, and an etch stop layer situated under the sacrificial layer, and wherein the diaphragm arrangement is developed in the diaphragm layer, a cavity being under the at least one diaphragm arrangement in the sacrificial layer, and wherein the cavity extends over the entire depth of the sacrificial layer, and is bordered by the etch stop layer; and
at least one stabilizing element to stabilize the diaphragm, the at least one stabilizing element extending into the cavity.

2. The structural element of claim 1, wherein the sacrificial layer is made of amorphous, polycrystalline or monocrystalline $Si_{1-x}Ge_x$, where $0 \leq x \leq 1$.

3. The structural element of claim 1, wherein a lateral extension of the cavity is bordered by trenches in the sacrificial layer that are filled up with an etch stop material.

4. The structural element of claim 1, wherein the sacrificial layer has a thickness of at least 5 μm.

5. The structural element of claim 1, wherein the stabilizing element is in the form of one of a column, a crosspiece, a frame, honeycombs and nets.

6. The structural element of claim 1, wherein the stabilizing element is bonded to a floor of the cavity.

7. The structural element of claim 1, wherein the stabilizing element is not bonded to a floor of the cavity.

8. The structural element of claim 1, wherein the stabilizing element is massive, and is made of at least one of silicon oxide and silicon nitride.

9. The structural element of claim 1, wherein the stabilizing element includes a hollow space.

10. The structural element of claim 1, wherein the diaphragm is closed, and a specified pressure prevails in the cavity, the specified pressure being between a vacuum and an atmospheric pressure.

11. The structural element of claim 1, wherein the diaphragm is not closed, so that an environmental pressure prevails in the cavity.

12. The structural element of claim 1, wherein the layer construction, in an area of the diaphragm, includes at least one additional structure to reduce a vertical heat dissipation.

13. The structural element of claim 1, wherein circuit board conductors are formed on the diaphragm.

14. The structural element of claim 1, wherein the stabilizing element is produced by a trench process having subsequent oxidation.

* * * * *